US012313671B2

United States Patent
Xie et al.

(10) Patent No.: US 12,313,671 B2
(45) Date of Patent: May 27, 2025

(54) FAULT DETECTION CIRCUIT, METHOD AND POWER ADAPTER

(71) Applicant: Hynetek Semiconductor Co., Ltd., Shenzhen (CN)

(72) Inventors: Renjian Xie, Shenzhen (CN); Yingyang Ou, Shenzhen (CN)

(73) Assignee: Hynetek Semiconductor Co., Ltd., Shenzhen (CN)

( * ) Notice: Subject to any disclaimer, the term of this patent is extended or adjusted under 35 U.S.C. 154(b) by 50 days.

(21) Appl. No.: 18/367,608

(22) Filed: Sep. 13, 2023

(65) Prior Publication Data

US 2023/0417823 A1    Dec. 28, 2023

Related U.S. Application Data

(63) Continuation of application No. PCT/CN2021/106560, filed on Jul. 15, 2021.

(30) Foreign Application Priority Data

Mar. 15, 2021    (CN) .......................... 202110277716.6

(51) Int. Cl.
*H01H 31/02*    (2006.01)
*G01R 31/28*    (2006.01)

(52) U.S. Cl.
CPC ................ *G01R 31/2843* (2013.01)

(58) Field of Classification Search
CPC ........................ G01R 31/52; G01R 31/2843
See application file for complete search history.

(56) References Cited

U.S. PATENT DOCUMENTS

| 8,742,780 B2* | 6/2014 | Kim ................. G01R 31/31717 324/750.3 |
| 9,906,143 B1* | 2/2018 | Yu ...................... H02M 3/33592 |
| 2009/0128209 A1* | 5/2009 | Chu ......................... H03K 7/08 327/177 |
| 2012/0063045 A1* | 3/2012 | Shearon ................... H02H 1/04 361/65 |

(Continued)

FOREIGN PATENT DOCUMENTS

| CN | 102983554 A | 3/2013 |
| CN | 103944355 A | 7/2014 |

(Continued)

*Primary Examiner* — Thang X Le
(74) *Attorney, Agent, or Firm* — IPRO, PLLC (57) ABSTRACT

An fault detection circuit includes a first comparison unit, a second comparison unit, an impedance unit and a digital control unit, the first comparison unit is configured to output a first judgment signal based on the voltage across a sampling resistor; the second comparison unit is configured to output a second judgment signal based on the voltage across the impedance unit, or the second comparison unit is configured to output a second judgment signal based on the voltage across the circuit in which the sampling resistor is connected in series with the impedance unit, and the digital control unit is configured to determine the working state of the sampling resistor based on the first judgment signal and the second judgment signal. Through the above method, the accuracy of overcurrent protection can be improved under the condition where the sampling resistor fails.

18 Claims, 6 Drawing Sheets

(56) References Cited

U.S. PATENT DOCUMENTS

| | | | | |
|---|---|---|---|---|
| 2014/0016376 | A1* | 1/2014 | Gao | H02M 3/33507 |
| | | | | 363/21.17 |
| 2016/0056704 | A1* | 2/2016 | Deboy | H02M 3/33523 |
| | | | | 363/21.13 |
| 2018/0191254 | A1* | 7/2018 | Feng | H02M 1/32 |
| 2019/0170803 | A1* | 6/2019 | Park | G01R 31/52 |

FOREIGN PATENT DOCUMENTS

| | | | |
|---|---|---|---|
| CN | 205882810 U | | 1/2017 |
| CN | 206164074 U | | 5/2017 |
| JP | H07177737 | * | 7/1995 |

* cited by examiner

Prior Art

FAULT DETECTION CIRCUIT, METHOD AND POWER ADAPTER

CROSS-REFERENCE TO RELATED APPLICATIONS

The present application claims priority to Chinese Patent Application No. 202110277716.6, filed with the Chinese Patent Office on Mar. 15, 2021, titled "A FAULT DETECTION CIRCUIT AND METHOD, POWER ADAPTER AND ELECTRONIC EQUIPMENT", the entire contents of which are incorporated herein by reference.

TECHNICAL FIELD

The present application relates to the field of electronic circuits, and for example, relates to a fault detection circuit and method, a power adapter and an electronic equipment.

BACKGROUND

Common USB-PD power adapters usually include a primary-side circuit and a secondary-side circuit, and both the primary-side circuit and the secondary-side circuit are disclosed a sampling resistor for collecting current signals of the primary side or the secondary side to realize the function of overcurrent protection.

In the prior art, if the sampling resistor on the secondary side is short-circuited, then over current protection needs to be realized through the resistor on the primary side.

SUMMARY

In a first aspect, an embodiment of the present application discloses a fault detection circuit. The fault detection circuit includes:
  a first comparison unit, a second comparison unit, an impedance unit and a digital control unit;
  the first comparison unit is connected with a sampling resistor and the digital control unit respectively, and is configured to output a first judgment signal to the digital control unit based on the voltage across the sampling resistor;
  the second comparison unit is connected with the digital control unit and the impedance unit respectively, and the impedance unit is connected in series with the sampling resistor, the second comparison unit is configured to output a second judgment signal to the digital control unit based on the voltage across the impedance unit, or the second comparison unit is respectively connected with the digital control unit and a circuit in which the sampling resistor is connected in series with the impedance unit, and the second comparison unit is configured to output a second judgment signal to the digital control unit based on the voltage across the circuit in which the sampling resistor is connected in series with the impedance unit;
  the digital control unit is configured to determine the working state of the sampling resistor based on the first judgment signal and the second judgment signal.

In an optional mode, the fault detection circuit is applied to a USB-PD power adapter system, wherein the USB-PD power adapter system includes a sampling resistor, a first amplifier, a transformer, a first switch tube and a USB interface, a first end of the sampling resistor is connected with a non-inverting input end of the first amplifier and a second end of the secondary side of the transformer, a second end of the sampling resistor is connected with an inverting input end of the first amplifier and the ground of the USB interface, a first end of the first switch tube is connected with a power pin of the USB interface, a second end of the first switch tube is connected with a first end of the secondary side of the transformer, and the fault detection circuit includes:
  the first comparison unit comprising a first comparator;
  a non-inverting input end of the first comparator is connected with an output end of the first amplifier, an inverting input end of the first comparator is connected with a first reference voltage, and an output end of the first comparator is connected with the digital control unit.

In an optional mode, a first input end of the second comparison unit is connected with the second end of the first switch tube, a second input end of the second comparison unit is connected with the first end of the first switch tube, and an output end of the second comparison unit is connected with the digital control unit;
  wherein the first switch tube is the impedance unit.

In an optional mode, the fault detection circuit further includes a first resistor;
  a first end of the first resistor is connected with the first end of the sampling resistor, the second end of the sampling resistor is connected with the first input end of the second comparison unit and the ground of the USB interface, the second input end of the second comparison unit is connected with the second end of the sampling resistor, and the output end of the second comparison unit is connected with the digital control unit;
  wherein the first resistor is the impedance unit.

In an optional mode, the fault detection circuit further includes a second resistor;
  a first end of the second resistor is connected with the first end of the secondary side of the transformer and the first input end of the second comparison unit, a second end of the second resistor is connected with the second input end of the second comparison unit and the second end of the first switch tube, the output end of the second comparison unit is connected with the digital control unit;
  wherein the second resistor is the impedance unit.

In an optional mode, the first input end of the second comparison unit is connected with the ground of the USB interface, the second input end of the second comparison unit is connected with the second end of the sampling resistor, and the output end of the second comparison unit is connected with the digital control unit;
  wherein the first end of the sampling resistor does not coincide with the ground of the USB interface, then the impedance of a printed circuit board between the sampling resistor and the ground of the USB interface on the USB-PD power adapter system is the impedance unit.

In an optional mode, the second comparison unit includes a second amplifier and a second comparator;
  a non-inverting input end of the second amplifier is the first input end of the second comparison unit, an inverting input end of the second amplifier is the second input end of the second comparison unit, an output end of the second amplifier is connected with a non-inverting input end of the second comparator, an inverting input end of the second comparator is connected with a second reference voltage, and an output end of the second comparator is the output end of the second comparison unit.

In a second aspect, an embodiment of the present application discloses a fault detection method, which includes:
acquiring a voltage across the sampling resistor, and acquiring a first judgment signal based on the voltage across the sampling resistor;
acquiring a voltage across an impedance unit connected in series with the sampling resistor, and acquiring a second judgment signal based on the voltage across the impedance unit, or acquiring a voltage across a circuit in which the sampling resistor is connected in series with the impedance unit, and acquiring a second judgment signal based on the voltage across the circuit in which the sampling resistor is connected in series with the impedance unit; and
determining the working state of the sampling resistor based on the first judgment signal and the second judgment signal.

In an optional mode, the sampling resistor is connected with a first amplifier, and the first amplifier is connected with a first comparator, and the operation of acquiring a voltage across the sampling resistor and acquiring a first judgment signal based on the voltage across the sampling resistor includes:
collecting the voltage across the sampling resistor by the first amplifier, and outputting a first intermediate signal to the first comparator based on the voltage across the sampling resistor; and
outputting a first judgment signal by the first comparator.

In an optional mode, the impedance unit is connected with a second amplifier, or a circuit in which the sampling resistor is connected in series with the impedance unit is connected with the second amplifier, and the second amplifier is connected with a second comparator,
the operation of acquiring a voltage across an impedance unit connected in series with the sampling resistor, and acquiring a second judgment signal based on the voltage across the impedance unit, or acquiring a voltage across a circuit in which the sampling resistor is connected in series with the impedance unit, and acquiring a second judgment signal based on the voltage across the circuit in which the sampling resistor is connected in series with the impedance unit includes:
collecting the voltage across the impedance unit by the second amplifier, and outputting a second intermediate signal to the second comparator based on the voltage across the impedance unit,
or
collecting the voltage across the circuit in which the sampling resistor is connected in series with the impedance unit by the second amplifier, and outputting a second intermediate signal to the second comparator based on the voltage across the circuit in which the sampling resistor is connected in series with the impedance unit;
the second comparator is configured to output a second judgment signal based on the second intermediate signal.

In a third aspect, an embodiment of the present application discloses a power adapter, and the power adapter includes the fault detection circuit as described above.

In a fourth aspect, an embodiment of the present application discloses an electronic equipment, which includes:
a digital control unit, comprising:
at least one processor and a memory communicatively connected with the at least one processor, wherein the memory stores instructions executable by the at least one processor, and the instructions are executed by the at least one processor so that the at least one processor are capable of executing the method as described above.

In a fifth aspect, an embodiment of the present application discloses a nonvolatile computer-readable storage medium, the computer-readable storage medium stores computer-executable instructions which, when executed by an electronic equipment, cause the electronic equipment to execute the method as described above.

In a sixth aspect, an embodiment of the present application further discloses a computer program product, the computer program product includes a computer program stored on a nonvolatile computer-readable storage medium, the computer program includes program instructions which, when executed by an electronic equipment, cause the electronic equipment to execute the method as described above.

BRIEF DESCRIPTION OF THE DRAWINGS

One or more embodiments are illustrated by pictures in corresponding attached drawings, and this does not constitute limitation on the embodiments, elements with the same reference numerals in the attached drawings are shown as similar elements, and the pictures in the attached drawings do not constitute scale limitation unless otherwise stated particularly.

DETAILED DESCRIPTION

In order to facilitate the understanding of the present application, the present application will be described in more detail hereinafter with reference to the attached drawings and specific embodiments. It shall be noted that when an element is expressed as being "fixed" to another element, it may be directly on the other element, or there may be one or more intervening elements therebetween. When an element is expressed as being "connected" to another element, it may be directly connected with the other element, or there may be one or more intervening elements therebetween. Terms such as "upper", "lower", "left", "right", "inner", "outer" and similar expressions used in this specification are for illustration purposes only.

Unless otherwise defined, all technical and scientific terms used in this specification have the same meanings as commonly understood by those skilled in the art of the present application. In this specification, the terms used in the specification of the present application are only for the purpose of describing specific embodiments, and are not intended to limit the present application. The term "and/or" used in this specification includes any and all combinations of one or more associated items listed.

Figure 1:
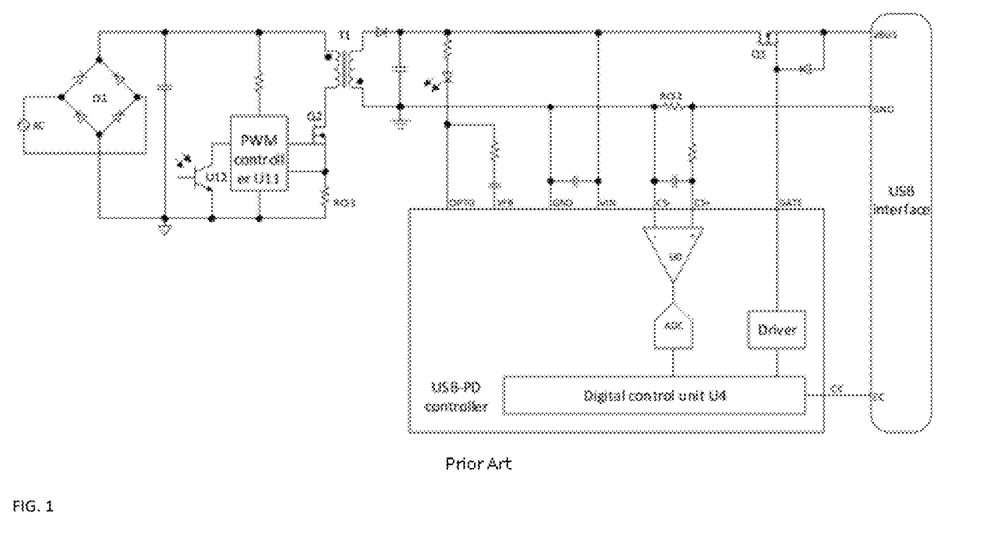
FIG. 1 is a schematic structural diagram of a USB-PD power adapter system in the prior art.

Please refer to FIG. 1, which is a schematic structural diagram of a USB-PD power adapter system in the prior art. As shown in FIG. 1, the USB-PD power adapter system in the prior art includes a rectifier bridge D1, a PWM controller U11, an optocoupler U12, a primary-side main switch tube Q2, a transformer T1, a USB-PD controller, a load switch tube Q1 and a USB interface.

The PWM controller U11 is located at the primary side of the transformer T1, receives the voltage regulating signal of the USB-PD controller through the optocoupler U12, controls the primary-side main switch tube Q2, and transfers the electrical energy rectified by the rectifier bridge D1 from the primary side to the secondary side through the transformer T1. The USB-PD controller is located at the secondary side of the transformer T1, and performs communication handshaking with the power receiving equipment through a CC signal line, and at the same time collects current and voltage signals that are output to form signals for adjusting the optocoupler U12 and controlling the load switch tube Q1. The optocoupler U12 controls the PWM controller U11, adjusts the output voltage, and realizes the closed-loop operation of the whole power supply. The USB interface is connected with the power receiving equipment of the power adapter, that is, the load of the power supply. The power receiving equipment requests the power supply voltage from the USB-PD controller through the CC signal line.

In practical application, the PWM controller U11 collects the current signal of the primary side of the transformer T1 through a resistor RCS1 to realize overcurrent protection and other functions. The USB-PD controller collects the current signal output by the power adapter through a resistor RCS2 to realize overcurrent protection and other functions. When the load draws excessive current from the power adapter, over current signals can be collected by both the PWM controller U11 and a USB-PD chip. In the case of a single fault, for example, when the resistor RCS1 is short-circuited, the USB-PD controller can realize overcurrent protection by sampling the resistor RCS2; for another example, when the resistor RCS2 is short-circuited, the PWM controller can realize overcurrent protection by sampling the resistor RCS2.

However, only the resistor RCS2 can really collect the output current of the power adapter. The current collected by the resistor RCS1 is the current of the primary side of the transformer T1 instead of the output current of the power adapter, and the current information is not directly proportional to the output current of the power adapter, but changes with the change of AC input voltage and output voltage. Therefore, the accuracy of overcurrent protection realized by the resistor RCS1 is low. In the case where the power of the power adapter is small, the low accuracy of overcurrent protection does not matter much, as long as the overcurrent is limited to standard requirements. However, if the power of the power adapter is very large and the output current is very large, then the overcurrent protection of the resistor RCS1 will easily exceed the overcurrent protection specification. Therefore, in the case where the power of the power adapter is large, extra measures must be taken.

Based on the above description, the present application discloses a fault detection circuit which can achieve protection through the power adapter when the resistor RCS2 of a single fault is short-circuited, thereby improving the accuracy of overcurrent protection when the sampling resistor fails.

Figure 2:
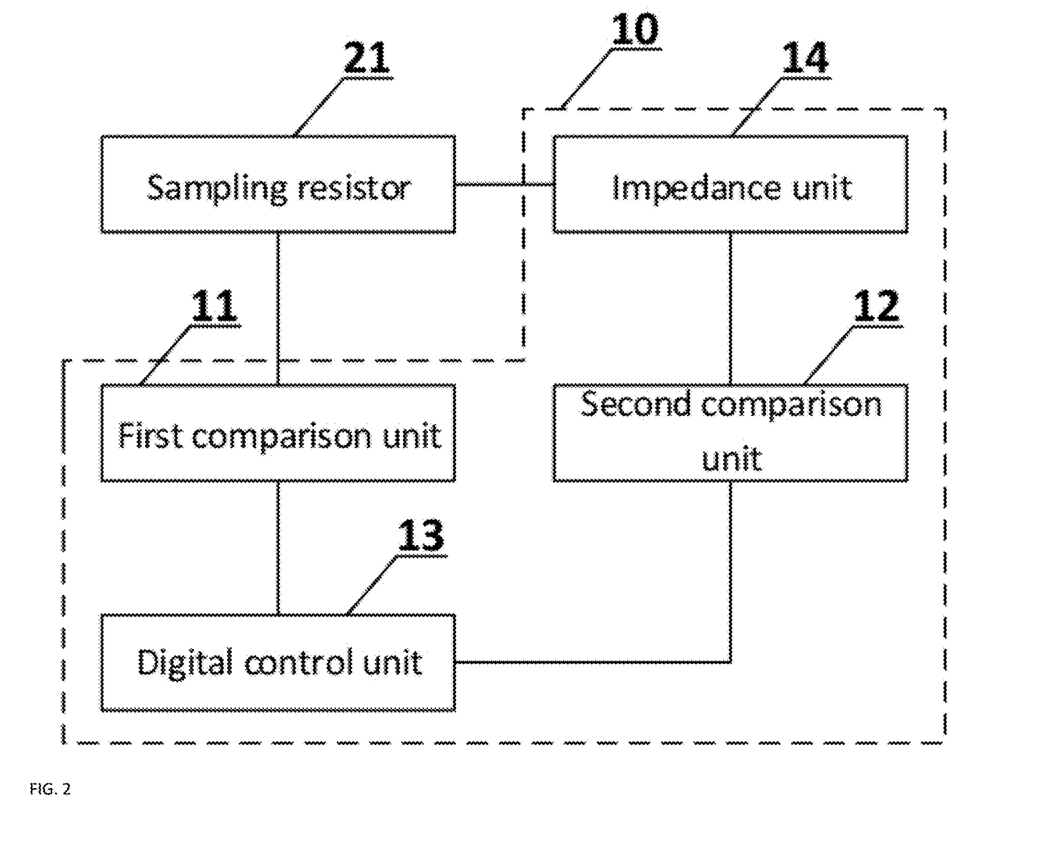
FIG. 2 is a schematic structural diagram of a fault detection circuit according to an embodiment of the present application.
Figure 3:
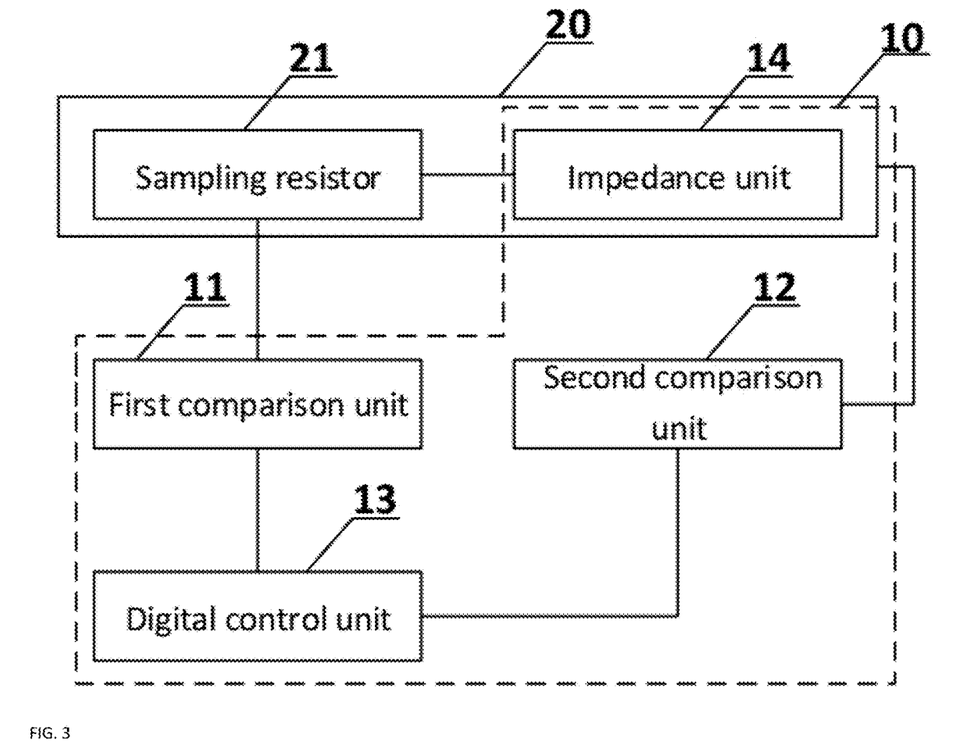
FIG. 3 is a schematic structural diagram of a fault detection circuit according to another embodiment of the present application.

Please refer to FIG. 2 and FIG. 3 together, the fault detection circuit 10 includes a first comparison unit 11, a second comparison unit 12, a digital control unit 13 and an impedance unit 14, wherein the first comparison unit 11 is connected with a sampling resistor 21 and a digital control unit 22 respectively, the first comparison unit 11 can collect the voltage across the sampling resistor 21 and output a first judgment signal to the digital control unit 22 according to the voltage across the sampling resistor 21.

As shown in FIG. 2, the second comparison unit 11 may be connected with the digital control unit 13 and the impedance unit 14 respectively, and the impedance unit 14 is connected in series with the sampling resistor 21. At this point, the second comparison unit 12 collects the voltage across the impedance unit 14 and outputs a second judgment signal to the digital control unit 22 according to the voltage across the impedance unit 14.

As shown in FIG. 3, the second comparison unit 11 may also be respectively connected with the digital control unit 13 and a circuit 20 in which the sampling resistor 21 is connected in series with the impedance unit. At this point, the second comparison unit 12 collects the voltage across the circuit 20 in which the sampling resistor 21 is connected in series with the impedance unit, and outputs a second judgment signal to the digital control unit 22.

The impedance unit 14 represents a circuit element that can block the current, such as a resistor, a switch tube with internal resistance or a printed circuit board with impedance.

Then, the digital control unit 22 can make a comprehensive judgment according to the received first judgment signal and second judgment signal to determine the working state of the sampling resistor. The working state of the sampling resistor includes a normal working state and a short-circuit state.

When the sampling resistor 21 is in a normal working state, voltage drops exist at both ends of the sampling resistor 21, both ends of the impedance unit 14, and both ends of the circuit 20 in which the sampling resistor 21 is connected in series with the impedance unit 14; at this point, the inputs of the first comparison unit 11 and the second comparison unit 12 are all voltages greater than 0, so the first comparison unit 11 and the second comparison unit 12 can output the first judgment signal and the second judgment signal both of which having a high level to the digital control unit 13. When the sampling resistor 21 is in a short-circuit state, there is no voltage drop across the sampling resistor 21 and there is a voltage drop across the impedance unit 22, so there is also a voltage drop across the circuit 20 in which the sampling resistor 21 is connected in series with the impedance unit 14; then, at this point, the input voltage of the first comparison unit 11 is 0 and the input voltage of the second comparison unit 12 is still greater than 0, so the first comparison unit 11 can output a low-level signal while the second comparison unit 12 still outputs a high-level signal. To sum up, if the first judgment signal received by the digital control unit 13 is the same as the second judgment signal, and both the first judgment signal and the second judgment signal are at a high level, then it means that the sampling resistor 21 is in a normal working state, and the digital control unit 13 does not need to take any action; if the first judgment signal received is at a low level and the second judgment signal is at a high level, then it means that the sampling resistor 21 is in a short-circuit state, and the digital control unit 13 can take corresponding measures to play the role of overcurrent protection.

Figure 4:
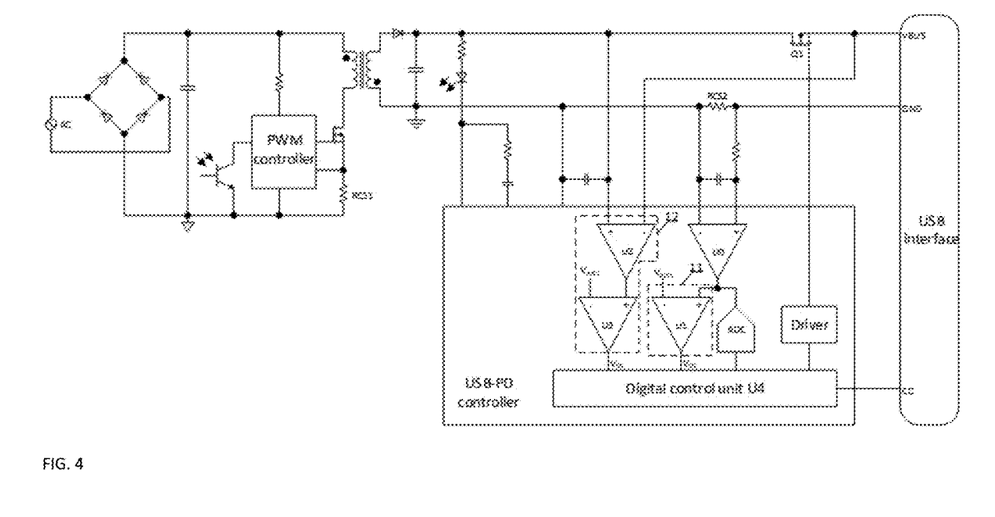
FIG. 4 is a schematic structural diagram illustrating the application of a fault detection circuit according to an embodiment of the present application to a USB-PD power adapter system.

In an embodiment, as shown in FIG. 4, the fault detection circuit shown in FIG. 2 is applied to the USB-PD power adapter system; as can be known from the above description, the USB-PD power adapter system includes a sampling resistor RCS2, a first amplifier U0, a transformer T1, a first switch tube Q1 and a USB interface, a first end of the sampling resistor RCS2 is connected with a non-inverting input end of the first amplifier U0 and a second end of the secondary side of the transformer T1, a second end of the sampling resistor RCS2 is connected with a inverting input end of the first amplifier U0 and the ground GND of the USB interface, a first end of the first switch tube Q1 is connected with a power pin VBUS of the USB interface, and a second end of the first switch tube Q1 is connected with a first end of the secondary side of the transformer T1. The sampling resistor RCS2 corresponds to the sampling resistor 21 in FIG. 2 or FIG. 3.

In this embodiment, the first comparison unit 101 includes a first comparator U1, wherein a non-inverting input end of the first comparator U1 is connected with an output end of the first amplifier U0, a inverting input end of the first comparator U1 is connected with a first reference voltage VREF1, and an output end of the first comparator U1 is connected with the digital control unit U4.

Optionally, the second comparison unit 102 includes a second amplifier U2 and a second comparator U3, wherein a non-inverting input end of the second amplifier U2 is connected with the second end of the first switch tube Q1 (i.e., corresponding to the load switch tube Q1 in FIG. 1) of the USB-PD power adapter system, an inverting input end of the second amplifier U2 is connected with the first end of the first switch tube Q1 and a power output end VBUS of the USB-PD power adapter system, an output end of the second amplifier U2 is connected with a non-inverting input end of the second comparator U3, an inverting input end of the second comparator U3 is connected with a second reference voltage VREF2, and an output end of the second comparator U3 is connected with the digital control unit U4. The non-inverting input end of the second amplifier U2 is a first input end of the second comparison unit 102, the inverting input end of the second amplifier U2 is a second input end of the second comparison unit 102, and the output end of the second comparator U3 is an output end of the second comparison unit 102.

As shall be appreciated, the specific values of the first reference voltage VREF1 and the second reference voltage VREF2 may be set correspondingly according to the actual application situation, and the first reference voltage VREF1 may be the same as or different from the second reference voltage VREF2.

Meanwhile, the first switch tube Q1 may be one of a triode, a MOS tube or an IGBT switch tube, and the first switch tube Q1 may be a P-type switch tube or an N-type switch tube. Taking the case where the first switch tube Q1 is a N-type MOS tube as an example, the gate of the MOS tube is the control end of the first switch tube Q1, the source of the MOS tube is the first end of the first switch tube Q1, and the drain of the MOS tube is the second end of the first switch tube Q1.

Specifically, the case where both the first reference voltage VREF1 and the second reference voltage VREF2 are set to be greater than 0 (e.g., 0.5 V) is taken as an example for illustration.

When the sampling resistor RCS2 is not short-circuited, on the one hand, the voltage across the sampling resistor RCS2 is greater than 0, then the output voltage of the first amplifier U0 is greater than 0, and at this point, it is necessary to set the output voltage of the first amplifier U0 to be greater than the first reference voltage VREF1 to ensure that the first judgment signal V01 output by the first comparator U1 is at a high level under normal circumstances. On the other hand, due to the on-resistance inside the load switch tube Q1, the differential voltage across the load switch tube Q1 is in direct proportion to the output current of the USB-PD power adapter system, and at this point, the input of the second amplifier U2 is the differential voltage across the load switch tube Q1, the output of the second amplifier U2 is greater than 0, and the output voltage of the second amplifier U2 needs to be set to be greater than the second reference voltage VREF2, so that the second judgment signal V02 output by the second comparator U3 is also at a high level.

When the sampling resistor RCS2 is short-circuited, on the one hand, the voltage across the sampling resistor RCS2 is close to zero (the sampling resistor RCS2 is equivalent to a connecting line), then the output voltage of the first amplifier U0 is close to zero or is zero, and at this point, it is necessary to set the output voltage of the first amplifier U0 to be less than the first reference voltage VREF1, and then the first judgment signal V01 output by the first comparator U1 is at a low level. On the other hand, because the load switch tube Q1 is in a normal working state, the input of the second amplifier U2 is the differential voltage across the load switch tube Q1, the output of the second amplifier U2 is still greater than 0, and the output voltage of the second amplifier U2 is greater than the second reference voltage VREF2, so that the second judgment signal V02 output by the second comparator U3 remains at a high level.

It shall be appreciated that, the first switch tube Q1 at this point is the impedance unit, i.e., corresponding to the impedance unit 14 in FIG. 2 or FIG. 3.

As can be known from the above description, when both the first judgment signal V01 output by the first comparator U1 and the second judgment signal V02 output by the second comparator U3 are at a high level, the working state of the sampling resistor RCS2 is normal, that is, the sampling resistor RCS2 is not short-circuited. When the first judgment signal V01 output by the first comparator U1 is at a low level and the second judgment signal V02 output by the second comparator U3 is at a high level, the working state of the sampling resistor RCS2 is in a short-circuit state, that is, the sampling resistor RCS2 is short-circuited. Therefore, the digital control unit U4 can determine whether a short-circuit fault occurs to the sampling resistor RCS2 through the received first judgment signal V01 and second judgment signal V02, and meanwhile, when a short-circuit fault occurs to the sampling resistor RCS2, protective measures can be triggered in time to turn off the output of the USB-PD power adapter system (for example, control the load switch tube Q1 to be turned off), thereby playing the role of overcurrent protection; moreover, since the output current of the USB-PD power adapter system is directly monitored, it will not exceed the overcurrent protection specification.

Figure 5:
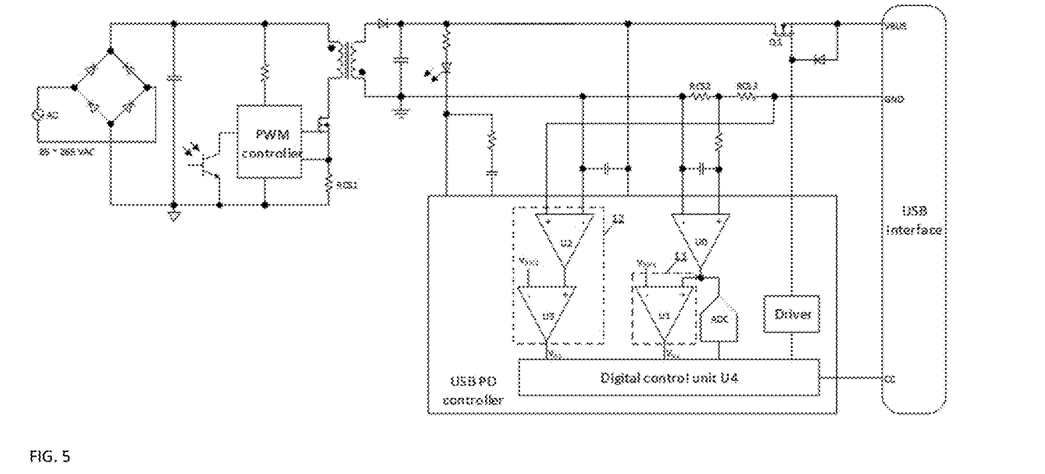
FIG. 5 is a schematic structural diagram illustrating the application of a fault detection circuit according to another embodiment of the present application to a USB-PD power adapter system.

In an embodiment, as shown in FIG. 5, the fault detection circuit further includes a first resistor RCS3. A first end of the first resistor RCS3 is connected with the first end of the sampling resistor RCS2 and the non-inverting input end of the first amplifier U0, a second end of the first resistor RCS3 is connected with the non-inverting input end of the second amplifier U2 and the ground of the USB interface of the USB-PD power adapter system, the reverse input end of the second amplifier U2 is connected with the second end of the sampling resistor RCS2, an output end of the second amplifier U2 is connected with the non-inverting input end of the second comparator U3, the inverting input end of the second comparator U3 is connected with the second reference voltage VREF2, and the output end of the second comparator U3 is connected with the digital control unit U4. The non-inverting input end of the second amplifier U2 is the first input end of the second comparison unit 102, the inverting input end of the second amplifier U2 is the second input end of the second comparison unit 102, and the output end of the second comparator U3 is the output end of the second comparison unit 102.

It shall be appreciated that, in the embodiment shown in FIG. 5, the specific implementation process of the first comparator U1 is the same as that of the above-mentioned embodiments, and thus will not be further described herein.

Meanwhile, the first resistor RCS3 at this point acts as an impedance unit, i.e., corresponding to the impedance unit 14 in FIG. 2 or FIG. 3.

When the sampling resistor RCS2 is not short-circuited, on the one hand, the first judgment signal V01 output by the first comparator U1 is at a high level as can be known from the above-mentioned embodiments. On the other hand, the second amplifier U2 collects the voltage across a circuit as a whole in which the sampling resistor RCS2 is connected in series with the first resistor RCS3. At this point, because there is voltage drop across each of the sampling resistor RCS2 and the first resistor RCS3, the voltage input from the non-inverting input end of the second amplifier U2 is greater than the voltage input from the inverting input end of the second amplifier U2, the output voltage of the second amplifier U2 is greater than the second reference voltage VREF2, and the second judgment signal V02 output by the second comparator U3 is at a high level.

When the sampling resistor RCS2 is short-circuited, on the one hand, the voltage across the sampling resistor RCS2 is close to zero, and the first judgment signal V01 output by the first comparator U1 is at a low level. On the other hand, although the sampling resistor RCS2 is short-circuited, the voltage drop across the first resistor RCS3 still exists, and the input of the second amplifier U2 is the differential voltage across the first resistor RCS3, that is, the second amplifier can still collect the information of the output current. Therefore, the output of the second amplifier U2 is greater than the second reference voltage VREF2, that is, the voltage at the non-inverting input end of the second comparator U3 is greater than the voltage at the inverting input end, so that the second judgment signal V02 output by the second comparator U3 remains at a high level.

Similarly, when both the first judgment signal V01 output by the first comparator U1 and the second judgment signal V02 output by the second comparator U3 are at a high level, the sampling resistor RCS2 is not short-circuited. When the first judgment signal V01 output by the first comparator U1 is at a low level and the second judgment signal V02 output by the second comparator U3 is at a high level, the sampling resistor RCS2 is short-circuited. Then, the digital control unit U4 can determine whether a short-circuit fault occurs to the sampling resistor RCS2, and when the short-circuit fault occurs to the sampling resistor RCS2, protective measures are triggered in time to turn off the output of the USB-PD power adapter system, thereby playing the role of overcurrent protection.

Figure 6:
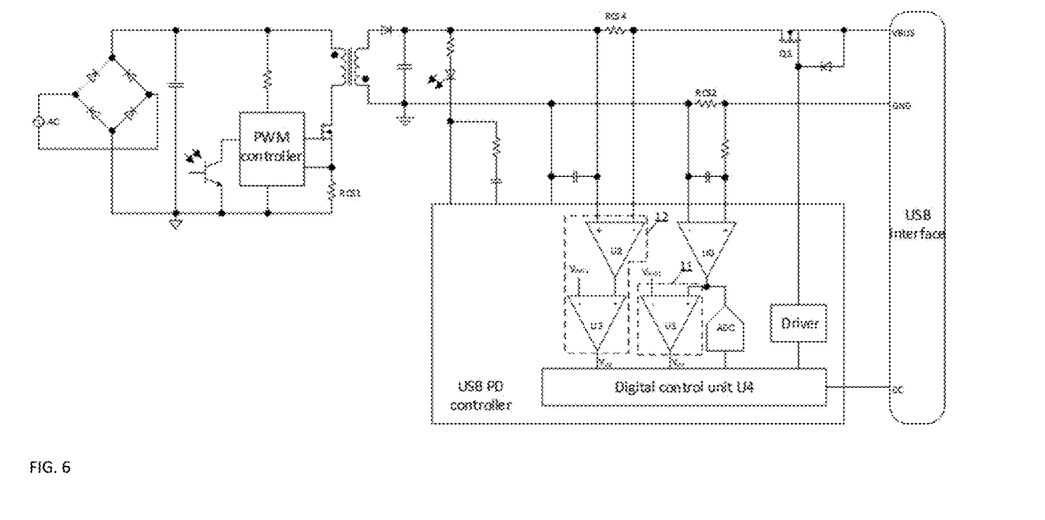
FIG. 6 is a schematic structural diagram illustrating the application of a fault detection circuit according to yet another embodiment of the present application to a USB-PD power adapter system.

Optionally, as shown in FIG. 6, the fault detection circuit further includes a second resistor RCS4, wherein a first end of the second resistor RCS4 is connected with the heteronym end of the secondary side of the transformer T1 of the USB-PD power adapter system and the non-inverting input end of the second amplifier U2, a second end of the second resistor RCS4 is connected with the inverting input end of the second amplifier U2 and the first end of the first switch tube Q1 of the USB-PD power adapter system, the output end of the second amplifier U2 is connected with the non-inverting input end of the second comparator U3, the inverting input end of the second comparator U3 is connected with the second reference voltage VREF2, and the output end of the second comparator U3 is connected with the digital control unit U4. The non-inverting input end of the second amplifier U2 is the first input end of the second comparison unit 102, the inverting input end of the second amplifier U2 is the second input end of the second comparison unit 102, and the output end of the second comparator U3 is the output end of the second comparison unit 102.

As shall be appreciated that, in the embodiment shown in FIG. 6, the specific implementation process of the first comparator U1 is the same as the above-mentioned embodiments, and thus will not be further described herein.

Meanwhile, the second resistor RCS4 at this point acts as an impedance unit, i.e., corresponding to the impedance unit 14 in FIG. 2 or FIG. 3.

When the sampling resistor RCS2 is not short-circuited, on the one hand, the first judgment signal V01 output by the first comparator U1 is at a high level as can be known from the above-mentioned embodiments. On the other hand, the second amplifier U2 collects the voltage across the second resistor RCS4. At this point, since there is a voltage drop across the first resistor RCS3, the voltage input from the non-inverting input end of the second amplifier U2 is greater than the voltage input from the inverting input end of the second amplifier U2, and the output voltage of the second amplifier U2 is greater than the second reference voltage VREF2, so the second judgment signal V02 output by the second comparator U3 is at a high level.

When the sampling resistor RCS2 is short-circuited, on the one hand, the voltage across the sampling resistor RCS2 is close to zero, and the first judgment signal V01 output by the first comparator U1 is at a low level. On the other hand, although the sampling resistor RCS2 is short-circuited, there is a voltage drop across the second resistor RCS4, and the input of the second amplifier U2 is the differential voltage across the second resistor RCS4, that is, the second amplifier can collect the information of the output current. Therefore, the output of the second amplifier U2 is greater than the second reference voltage VREF2, that is, the voltage at the non-inverting input end of the second comparator U3 is greater than the voltage at the inverting input end, so that the second judgment signal V02 output by the second comparator U3 remains at a high level.

Similarly, when both the first judgment signal V01 output by the first comparator U1 and the second judgment signal V02 output by the second comparator U3 are at a high level, the sampling resistor RCS2 is not short-circuited. When the first judgment signal V01 output by the first comparator U1 is at a low level and the second judgment signal V02 output by the second comparator U3 is at a high level, the sampling resistor RCS2 is short-circuited. Then, the digital control unit U4 can determine whether a short-circuit fault occurs to the sampling resistor RCS2, and when the short-circuit fault occurs to the sampling resistor RCS2, protective measures are triggered in time to turn off the output of the USB-PD power adapter system, thereby playing the role of overcurrent protection.

Figure 7:
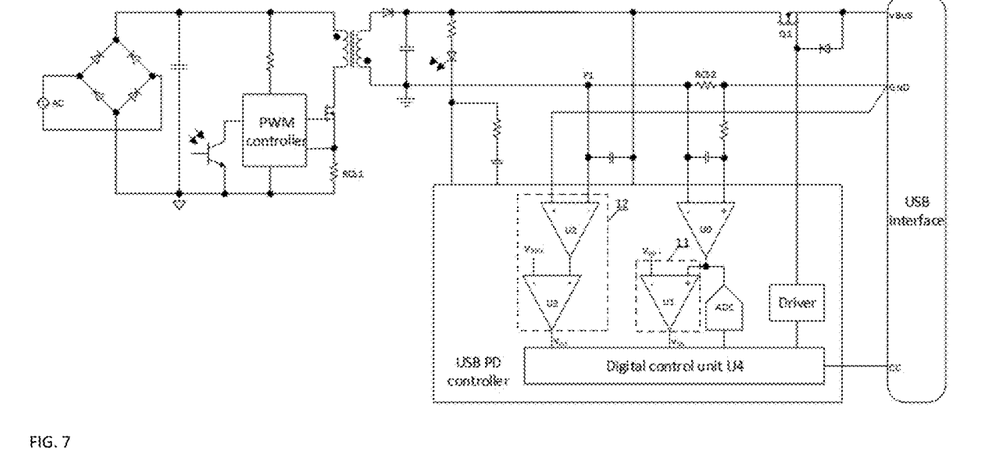
FIG. 7 is a schematic structural diagram illustrating the application of a fault detection circuit according to yet another embodiment of the present application to a USB-PD power adapter system.

In another embodiment, as shown in FIG. 7, at this point, the non-inverting input end of the second amplifier U2 is connected with the ground GND of the USB interface and the first end of the sampling resistor RCS2 of the USB-PD power adapter system, the inverting input end of the second amplifier U2 is connected to the connecting line between the second end of the secondary side of the transformer T1 and the second end of the sampling resistor RCS2 of the USB-PD power adapter system at a connection point P1, the output end of the second amplifier U2 is connected with the non-inverting input end of the second comparator U3, the inverting input end of the second comparator U3 is connected with the second reference voltage VREF2, and the output end of the second comparator U3 is connected with the digital control unit U4. The non-inverting input end of the second amplifier U2 is the first input end of the second comparison unit 102, the inverting input end of the second amplifier U2 is the second input end of the second comparison unit 102, and the output end of the second comparator U3 is the output end of the second comparison unit 102.

Similarly, in the embodiment shown in FIG. 7, the specific implementation process of the first comparator U1 is the same as the above-mentioned embodiments, and thus will not be further described herein.

Meanwhile, the first end of the sampling resistor RCS2 does not coincide with the ground GND of the USB interface, and at this point, the impedance of the printed circuit board between the connection point P1 and the sampling resistor RCS2 on the USB-PD power adapter system and between the sampling resistor RCS2 and the ground GND of the USB interface serves as the impedance units, i.e., corresponding to the impedance unit 14 in FIG. 2 or FIG. 3. Of course, when the connection point P1 coincides with the second end of the sampling resistor RCS2, the impedance unit at this point is the impedance of the printed circuit board between the sampling resistor RCS2 and the ground GND of the USB interface.

When the sampling resistor RCS2 is not short-circuited, on the one hand, the first judgment signal V01 output by the first comparator U1 is at a high level as can be known from the above-mentioned embodiments. On the other hand, the second amplifier U2 collects the voltage drop to ground at the ground position of the USB interface. At this point, due to the impedance of copper on the printed circuit board, it is equivalent to superposing the voltage drop of the sampling resistor RCS2 and the line voltage drop of a part of the printed circuit board at the input end of the second amplifier U2. Then, the output voltage of the second amplifier U2 is greater than the second reference voltage VREF2, so the second judgment signal V02 output by the second comparator U3 is at a high level.

When the sampling resistor RCS2 is short-circuited, on the one hand, the voltage across the sampling resistor RCS2 is close to zero, and the first judgment signal V01 output by the first comparator U1 is at a low level. On the other hand, although the sampling resistor RCS2 is short-circuited, the line voltage drop of the ground wire on the printed circuit board still exists, and the input of the second amplifier U2 is the line voltage drop of a part of the printed circuit board, that is, the second amplifier can collect the information of the output current. Therefore, the output of the second amplifier U2 is greater than the second reference voltage VREF2, that is, the voltage at the non-inverting input end of the second comparator U3 is greater than the voltage at the inverting input end, so that the second judgment signal V02 output by the second comparator U3 remains at a high level.

Similarly, when both the first judgment signal V01 output by the first comparator U1 and the second judgment signal V02 output by the second comparator U3 are at a high level, the sampling resistor RCS2 is not short-circuited. When the first judgment signal V01 output by the first comparator U1 is at a low level and the second judgment signal V02 output by the second comparator U3 is at a high level, the sampling resistor RCS2 is short-circuited. Then, the digital control unit U4 can determine whether a short-circuit fault occurs to the sampling resistor RCS2, and when the short-circuit fault occurs to the sampling resistor RCS2, protective measures are triggered in time to turn off the output of the USB-PD power adapter system, thereby playing the role of overcurrent protection.

It shall be noted that, in this embodiment, the non-inverting input end of the second amplifier U2 is connected to the ground GND of the USB interface of the USB-PD power adapter system, while in other embodiments, the non-inverting input end of the second amplifier U2 may also be connected to other positions on the line of the printed circuit board, as long as it is ensured that the voltage drop signal at the connected position is sufficiently strong.

Moreover, in the above-mentioned embodiments of FIG. 4 to FIG. 7, since the USB-PD power adapter system comes with the first amplifier connected with the sampling resistor, the first comparison unit only needs to include the first comparator and use the output of the first amplifier. While in other embodiments, if the sampling resistor is not connected with the first amplifier, then the first comparison unit should include the first amplifier and the first comparator, and the specific application process is similar to the above embodiments, and thus will not be further described herein.

Figure 8:
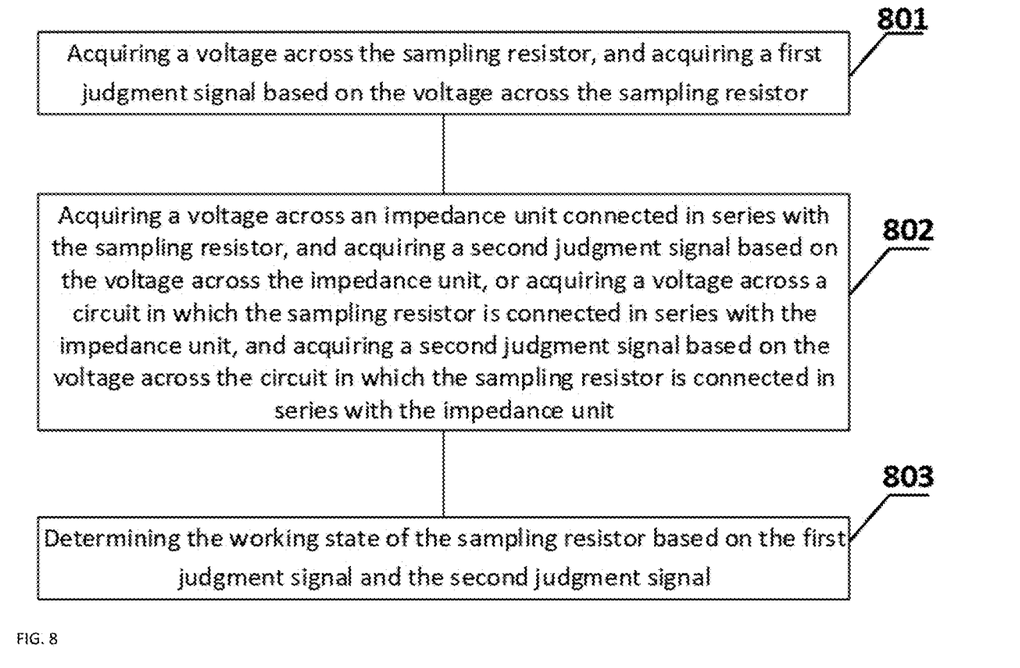
FIG. 8 is a flowchart diagram of a fault detection method according to an embodiment of the present application.

FIG. 8 is a fault detection method disclosed according to the present application, and steps of the method include:
  801: acquiring a voltage across the sampling resistor, and acquiring a first judgment signal based on the voltage across the sampling resistor.
  In an embodiment, if the sampling resistor is connected with the first amplifier and the first amplifier is connected with the first comparator, then the voltage across the sampling resistor may be collected by the first amplifier, and a first intermediate signal may be output to the first comparator according to the voltage across the sampling resistor. Then, a first judgment signal is output by the first comparator according to the first intermediate signal.
  802: acquiring a voltage across an impedance unit connected in series with the sampling resistor, and acquiring a second judgment signal based on the voltage across the impedance unit, or acquiring a voltage across a circuit in which the sampling resistor is connected in series with the impedance unit, and acquiring a second judgment signal based on the voltage across the circuit in which the sampling resistor is connected in series with the impedance unit.
  803: determining the working state of the sampling resistor based on the first judgment signal and the second judgment signal.

In an embodiment, if the impedance unit is connected with the second amplifier, then the voltage across the impedance unit is collected by the second amplifier. Moreover, if the second amplifier is connected with the second comparator, then the second amplifier outputs a second intermediate signal to the second comparator according to the voltage across the impedance unit, and then the second comparator outputs a second judgment signal according to the second intermediate signal.

If the circuit in which the impedance unit is connected in series with the sampling resistor is connected with the second amplifier, then the voltage across the circuit in which the impedance unit is connected in series with the sampling resistor is collected by the second amplifier. Moreover, if the second amplifier is connected with the second comparator, then the second amplifier outputs a second intermediate signal to the second comparator according to the voltage across the circuit in which the impedance unit is connected in series with the sampling resistor, and then the second comparator outputs a second judgment signal according to the second intermediate signal.

Finally, comprehensive judgment is made by taking the first judgment signal and the second judgment signal into consideration, so as to determine whether the sampling resistor is in a normal working state or a short-circuit state. An embodiment of the present application further discloses a power adapter, which includes the fault detection circuit as described in any of the embodiments described above.

Figure 9:
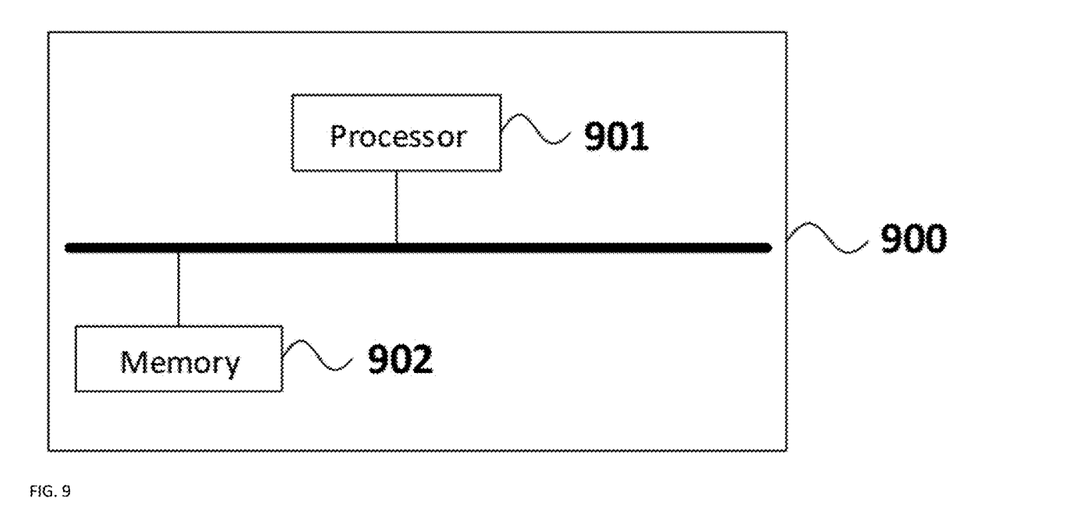
FIG. 9 is a schematic structural diagram of an electronic equipment according to an embodiment of the present application.

An embodiment of the present application further discloses an electronic equipment, and reference is made to FIG. 9, which shows the hardware structure of the electronic equipment capable of executing the fault detection method shown in FIG. 8.

An electronic equipment 900 includes at least one processor 901; and a memory 902 communicatively connected with the at least one processor 901, and one processor 901 is taken as an example in FIG. 9. The memory 902 stores instructions executable by the at least one processor 901, and the instructions are executed by the at least one processor 901 to enable the at least one processor 901 to execute the fault detection method shown in FIG. 8 described above. The processor 901 and the memory 902 may be connected by a bus or by other means, and bus connection is taken as an example in FIG. 9.

As a nonvolatile computer-readable storage medium, the memory 902 may be used to store nonvolatile software programs, nonvolatile computer executable programs and modules, such as program instructions/modules corresponding to the fault detection method in the embodiments of the present application. The processor 901 executes various functional applications and data processing of the server, i.e., implement the default detection method disclosed by the above embodiments of the method, by running the nonvolatile software programs, instructions and modules stored in the memory 902.

The memory 902 may include a program storage area and a data storage area, wherein the program storage area may store operating systems and application programs required by at least one function; and the data storage area may store data created according to the use of the fault detection circuit or the like. In addition, the memory 902 may include a high-speed random access memory, and may also include a nonvolatile memory, such as at least one magnetic disk memory device, flash memory device, or other nonvolatile solid-state memory device. In some embodiments, the memory 902 optionally includes memories remotely disclosed relative to the processor 901, and these remote memories may be connected to the fault detection circuit through a network. Examples of the above network include, but not limited to, the Internet, Intranet, local area networks, mobile communication networks and combinations thereof.

The one or more modules are stored in the memory 902, and when executed by the one or more processors 901, the one or more modules execute the default detection method in any of the embodiments of the methods described above, e.g., execute the steps of the methods of FIG. 8 described above.

The products described above may execute the method disclosed according to the embodiments of the present application, and have corresponding functional modules and beneficial effects for executing the method. For technical details not described in detail in this embodiment, reference may be made to the method disclosed according to the embodiments of the present application.

An embodiment of the present application further discloses a nonvolatile computer-readable storage medium storing computer executable instructions, and the computer executable instructions are executed by one or more processors to for example execute the steps of the methods of FIG. 8 described above.

An embodiment of the present application further discloses a computer program product, which includes a computer program stored on a nonvolatile computer-readable storage medium, and the computer program includes program instructions which, when executed by a computer, enable the computer to execute the fault detection method in any of the embodiments of the methods described above, e.g., execute the steps of the methods of FIG. 8 described above.

The embodiments of the devices described above are only for illustrative purpose, the units illustrated as separate components may be or may not be physically separated, and components displayed as units may be or may not be physical units; that is, these units and components may be located in one place or distributed over multiple network units. Some or all of the modules may be selected according to actual needs to achieve the objective of the solution of this embodiment.

From the description of the above embodiments, those of ordinary skill in the art may clearly appreciate that each embodiment may be realized by means of software plus a general hardware platform, and of course, it may also be realized by hardware. As shall be appreciated by those of ordinary skill in the art, the implementation of all or part of the processes in the embodiments of the methods described above may be completed by instructing related hardware through a computer program, the program may be stored in a computer-readable storage medium, and when it is executed, the program may include the processes of the embodiments of the methods described above. The storage medium may be a magnetic disk, an optical disk, a Read-Only Memory (ROM) or a Random Access Memory (RAM) or the like.

It shall be noted that, the specification of the present application and the attached drawings thereof disclose preferred embodiments of the present application, but the present application may be realized in many different forms and is not limited to the embodiments described in this specification, these embodiments do not serve as additional restrictions on the contents of the present application, and the purpose of providing these embodiments is to make the disclosure of the present application more thorough and comprehensive. Moreover, the above technical features continue to be combined with each other to form various embodiments not listed above, which are all regarded as within the scope recorded in the specification of the present application; furthermore, improvements or variations can be made by those of ordinary skill in the art according to the above description, and all these improvements and variations shall belong to the scope claimed in the appended claims of the present application.

The invention claimed is:

1. A fault detection circuit, comprising:
a first comparison unit, a second comparison unit, an impedance unit and a digital control unit;
the first comparison unit being connected with a sampling resistor and the digital control unit respectively, and being configured to output a first judgment signal to the digital control unit based on the voltage across the sampling resistor;
the second comparison unit being connected with the digital control unit and the impedance unit respectively, and the impedance unit being connected in series with the sampling resistor, the second comparison unit being configured to output a second judgment signal to the digital control unit based on the voltage across the impedance unit, or the second comparison unit being respectively connected with the digital control unit and a circuit in which the sampling resistor is connected in series with the impedance unit, and the second comparison unit being configured to output a second judgment signal to the digital control unit based on the voltage across the circuit in which the sampling resistor is connected in series with the impedance unit;
the digital control unit being configured to determine the working state of the sampling resistor based on the first judgment signal and the second judgment signal;
the fault detection circuit is applied to a USB-PD power adapter system, wherein the USB-PD power adapter system comprises a sampling resistor, a first amplifier, a transformer, a first switch tube and a USB interface, a first end of the sampling resistor is connected with a non-inverting input end of the first amplifier and a second end of the secondary side of the transformer, a second end of the sampling resistor is connected with an inverting input end of the first amplifier and the ground of the USB interface, a first end of the first switch tube is connected with a power pin of the USB interface, and a second end of the first switch tube is connected with a first end of the secondary side of the transformer, wherein the fault detection circuit comprises:
the first comparison unit comprising a first comparator;
a non-inverting input end of the first comparator is connected with an output end of the first amplifier, an inverting input end of the first comparator is connected with a first reference voltage, and an output end of the first comparator is connected with the digital control unit.

2. The fault detection circuit according to claim 1, wherein,
a first input end of the second comparison unit is connected with the second end of the first switch tube, a second input end of the second comparison unit is connected with the first end of the first switch tube, and an output end of the second comparison unit is connected with the digital control unit;
wherein the first switch tube is the impedance unit.

3. The fault detection circuit according to claim 2, wherein,
the second comparison unit comprises a second amplifier and a second comparator;
a non-inverting input end of the second amplifier is the first input end of the second comparison unit, an inverting input end of the second amplifier is the second input end of the second comparison unit, an output end of the second amplifier is connected with a non-inverting input end of the second comparator, an inverting input end of the second comparator is connected with a second reference voltage, and an output end of the second comparator is the output end of the second comparison unit.

4. The fault detection circuit according to claim 1, wherein,
the fault detection circuit further comprises a first resistor;
a first end of the first resistor is connected with the first end of the sampling resistor, the second end of the sampling resistor is connected with the first input end of the second comparison unit and the ground of the USB interface, the second input end of the second comparison unit is connected with the second end of the sampling resistor, and the output end of the second comparison unit is connected with the digital control unit;
wherein the first resistor is the impedance unit.

5. The fault detection circuit according to claim 4, wherein,
the second comparison unit comprises a second amplifier and a second comparator;
a non-inverting input end of the second amplifier is the first input end of the second comparison unit, an inverting input end of the second amplifier is the second input end of the second comparison unit, an output end of the second amplifier is connected with a non-inverting input end of the second comparator, an inverting input end of the second comparator is connected with a second reference voltage, and an output end of the second comparator is the output end of the second comparison unit.

6. The fault detection circuit according to claim 1, wherein,
the fault detection circuit further comprises a second resistor;
a first end of the second resistor is connected with the first end of the secondary side of the transformer and the first input end of the second comparison unit, a second end of the second resistor is connected with the second input end of the second comparison unit and the second end of the first switch tube, the output end of the second comparison unit is connected with the digital control unit;
wherein the second resistor is the impedance unit.

7. The fault detection circuit according to claim 6, wherein,
the second comparison unit comprises a second amplifier and a second comparator;
a non-inverting input end of the second amplifier is the first input end of the second comparison unit, an inverting input end of the second amplifier is the second input end of the second comparison unit, an output end of the second amplifier is connected with a non-inverting input end of the second comparator, an inverting input end of the second comparator is connected with a second reference voltage, and an output end of the second comparator is the output end of the second comparison unit.

8. The fault detection circuit according to claim 1, wherein,
the first input end of the second comparison unit is connected with the ground of the USB interface, the second input end of the second comparison unit is connected with the second end of the sampling resistor, and the output end of the second comparison unit is connected with the digital control unit;
wherein the first end of the sampling resistor does not coincide with the ground of the USB interface, then the impedance of a printed circuit board between the sampling resistor and the ground of the USB interface on the USB-PD power adapter system is the impedance unit.

9. The fault detection circuit according to claim 1, wherein,
the second comparison unit comprises a second amplifier and a second comparator;
a non-inverting input end of the second amplifier is the first input end of the second comparison unit, an inverting input end of the second amplifier is the second input end of the second comparison unit, an output end of the second amplifier is connected with a non-inverting input end of the second comparator, an inverting input end of the second comparator is connected with a second reference voltage, and an output end of the second comparator is the output end of the second comparison unit.

10. A fault detection method is applied to a fault detection circuit which comprises:
a first comparison unit, a second comparison unit, an impedance unit and a digital control unit;
the first comparison unit being connected with a sampling resistor and the digital control unit respectively, and being configured to output a first judgment signal to the digital control unit based on the voltage across the sampling resistor;
the second comparison unit being connected with the digital control unit and the impedance unit respectively, and the impedance unit being connected in series with the sampling resistor, the second comparison unit being configured to output a second judgment signal to the digital control unit based on the voltage across the impedance unit, or the second comparison unit being respectively connected with the digital control unit and a circuit in which the sampling resistor is connected in series with the impedance unit, and the second comparison unit being configured to output a second judgment signal to the digital control unit based on the voltage across the circuit in which the sampling resistor is connected in series with the impedance unit;
the digital control unit being configured to determine the working state of the sampling resistor based on the first judgment signal and the second judgment signal;
the fault detection circuit is applied to a USB-PD power adapter system, wherein the USB-PD power adapter system comprises a sampling resistor, a first amplifier, a transformer, a first switch tube and a USB interface, a first end of the sampling resistor is connected with a non-inverting input end of the first amplifier and a second end of the secondary side of the transformer, a second end of the sampling resistor is connected with an inverting input end of the first amplifier and the ground of the USB interface, a first end of the first switch tube is connected with a power pin of the USB interface, and a second end of the first switch tube is connected with a first end of the secondary side of the transformer, wherein the fault detection circuit comprises:
the first comparison unit comprising a first comparator;
a non-inverting input end of the first comparator is connected with an output end of the first amplifier, an inverting input end of the first comparator is connected with a first reference voltage, and an output end of the first comparator is connected with the digital control unit;
wherein the fault detection method comprises:
acquiring a voltage across the sampling resistor, and acquiring a first judgment signal based on the voltage across the sampling resistor;
acquiring a voltage across an impedance unit connected in series with the sampling resistor, and acquiring a second judgment signal based on the voltage across the impedance unit, or acquiring a voltage across a circuit in which the sampling resistor is connected in series with the impedance unit, and acquiring a second judgment signal based on the voltage across the circuit in which the sampling resistor is connected in series with the impedance unit; and
determining the working state of the sampling resistor based on the first judgment signal and the second judgment signal.

11. The method according to claim 10, wherein the sampling resistor is connected with a first amplifier, and the first amplifier is connected with a first comparator, and the step of acquiring a voltage across the sampling resistor and acquiring a first judgment signal based on the voltage across the sampling resistor comprises:
collecting the voltage across the sampling resistor by the first amplifier, and outputting a first intermediate signal to the first comparator based on the voltage across the sampling resistor; and
outputting a first judgment signal by the first comparator.

12. The method according to claim 10, wherein the impedance unit is connected with a second amplifier, or a circuit in which the sampling resistor is connected in series with the impedance unit is connected with the second amplifier, and the second amplifier is connected with a second comparator,
the step of acquiring a voltage across an impedance unit connected in series with the sampling resistor, and acquiring a second judgment signal based on the voltage across the impedance unit, or acquiring a voltage across a circuit in which the sampling resistor is connected in series with the impedance unit, and acquiring a second judgment signal based on the voltage across the circuit in which the sampling resistor is connected in series with the impedance unit comprises:
collecting the voltage across the impedance unit by the second amplifier, and outputting a second intermediate signal to the second comparator based on the voltage across the impedance unit,
or
collecting the voltage across the circuit in which the sampling resistor is connected in series with the impedance unit by the second amplifier, and outputting a second intermediate signal to the second comparator based on the voltage across the circuit in which the sampling resistor is connected in series with the impedance unit;
the second comparator is configured to output a second judgment signal based on the second intermediate signal.

13. A power adapter, comprising a fault detection circuit, the fault detection circuit, comprising:
a first comparison unit, a second comparison unit, an impedance unit and a digital control unit;
the first comparison unit being connected with a sampling resistor and the digital control unit respectively, and being configured to output a first judgment signal to the digital control unit based on the voltage across the sampling resistor;
the second comparison unit being connected with the digital control unit and the impedance unit respectively, and the impedance unit being connected in series with the sampling resistor, the second comparison unit being configured to output a second judgment signal to the digital control unit based on the voltage across the impedance unit, or the second comparison unit being respectively connected with the digital control unit and a circuit in which the sampling resistor is connected in series with the impedance unit, and the second comparison unit being configured to output a second judgment signal to the digital control unit based on the voltage across the circuit in which the sampling resistor is connected in series with the impedance unit;
the digital control unit being configured to determine the working state of the sampling resistor based on the first judgment signal and the second judgment signal;
the fault detection circuit is applied to a USB-PD power adapter system, wherein the USB-PD power adapter system comprises a sampling resistor, a first amplifier, a transformer, a first switch tube and a USB interface, a first end of the sampling resistor is connected with a non-inverting input end of the first amplifier and a second end of the secondary side of the transformer, a second end of the sampling resistor is connected with an inverting input end of the first amplifier and the ground of the USB interface, a first end of the first switch tube is connected with a power pin of the USB interface, and a second end of the first switch tube is connected with a first end of the secondary side of the transformer, wherein the fault detection circuit comprises:
the first comparison unit comprising a first comparator;
a non-inverting input end of the first comparator is connected with an output end of the first amplifier, an inverting input end of the first comparator is connected with a first reference voltage, and an output end of the first comparator is connected with the digital control unit.

14. The power adapter according to claim 13, wherein, a first input end of the second comparison unit is connected with the second end of the first switch tube, a second input end of the second comparison unit is connected with the first end of the first switch tube, and an output end of the second comparison unit is connected with the digital control unit;
wherein the first switch tube is the impedance unit.

15. The power adapter according to claim 13, wherein, the fault detection circuit further comprises a first resistor;
a first end of the first resistor is connected with the first end of the sampling resistor, the second end of the sampling resistor is connected with the first input end of the second comparison unit and the ground of the USB interface, the second input end of the second comparison unit is connected with the second end of the sampling resistor, and the output end of the second comparison unit is connected with the digital control unit;
wherein the first resistor is the impedance unit.

16. The power adapter according to claim 13, wherein, the fault detection circuit further comprises a second resistor;
a first end of the second resistor is connected with the first end of the secondary side of the transformer and the first input end of the second comparison unit, a second end of the second resistor is connected with the second input end of the second comparison unit and the second end of the first switch tube, the output end of the second comparison unit is connected with the digital control unit;
wherein the second resistor is the impedance unit.

17. The power adapter according to claim 13, wherein, the first input end of the second comparison unit is connected with the ground of the USB interface, the second input end of the second comparison unit is connected with the second end of the sampling resistor, and the output end of the second comparison unit is connected with the digital control unit;
wherein the first end of the sampling resistor does not coincide with the ground of the USB interface, then the impedance of a printed circuit board between the sampling resistor and the ground of the USB interface on the USB-PD power adapter system is the impedance unit.

18. The power adapter according to claim 13, wherein, the second comparison unit comprises a second amplifier and a second comparator;
a non-inverting input end of the second amplifier is the first input end of the second comparison unit, an inverting input end of the second amplifier is the second input end of the second comparison unit, an output end of the second amplifier is connected with a non-inverting input end of the second comparator, an inverting input end of the second comparator is connected with a second reference voltage, and an output end of the second comparator is the output end of the second comparison unit.

* * * * *